United States Patent [19]

Azar et al.

[11] Patent Number: 5,304,846
[45] Date of Patent: Apr. 19, 1994

[54] NARROW CHANNEL FINNED HEAT SINKING FOR COOLING HIGH POWER ELECTRONIC COMPONENTS

[75] Inventors: Kaveh Azar, Westwood, Mass.; Richard E. Caron, Salem, N.H.

[73] Assignee: AT&T Bell Laboratories, Murray Hill, N.J.

[21] Appl. No.: 69,683

[22] Filed: Jun. 1, 1993

Related U.S. Application Data

[63] Continuation of Ser. No. 807,687, Dec. 16, 1991, abandoned.

[51] Int. Cl.[5] ................. H01L 23/02; H01L 25/04
[52] U.S. Cl. ................................. 257/722; 361/690; 174/16.3; 165/80.3
[58] Field of Search ............... 357/81, 82; 361/383; 174/16.3; 165/80.3; 257/722

[56] References Cited

U.S. PATENT DOCUMENTS

| | | | |
|---|---|---|---|
| 4,103,737 | 8/1978 | Perkins | 165/80 |
| 4,620,216 | 10/1986 | Horvath | 357/81 |
| 4,682,651 | 7/1987 | Gabuzda | 165/80 |
| 4,823,869 | 4/1989 | Arnold et al. | 165/185 |
| 4,879,891 | 11/1989 | Hinshaw | 72/254 |
| 4,884,168 | 11/1989 | August et al. | 361/382 |
| 4,884,630 | 12/1989 | Nelson et al. | 165/170 |
| 4,884,631 | 12/1989 | Rippel | 165/185 |
| 4,922,378 | 5/1990 | Malhi et al. | 361/387 |
| 4,926,242 | 5/1990 | Itoh et al. | 357/81 |
| 4,987,478 | 1/1991 | Braun et al. | 357/81 |
| 5,003,429 | 3/1991 | Baker et al. | 361/386 |
| 5,014,117 | 5/1991 | Horvath et al. | 357/81 |
| 5,031,072 | 7/1991 | Malhi et al. | 361/387 |
| 5,133,403 | 7/1992 | Yokono et al. | 165/185 |
| 5,166,775 | 11/1992 | Bartilson | 361/383 |

FOREIGN PATENT DOCUMENTS

| | | |
|---|---|---|
| 2358443 | 6/1974 | Fed. Rep. of Germany . |
| 3528291 | 2/1987 | Fed. Rep. of Germany . |

OTHER PUBLICATIONS

Goldberg, N., "Narrow Channel Forced Air Heat Sink," IEEE Trans. on Components, Hybrids, & Manufac., vol. CHMT-7, No. 1, Mar. 1984, pp. 154–159.

Hilberg, et al., "High Performance Micro-Channel Air Cooling," Sixth IEEE Semi-Therm Symposium 1990, pp. 108–113.

D. B. Tuckerman et al., "High-Performance Heat Sinking for VLSI," IEEE Electron Device Letters, vol. EDL-2, No. 5, May 1981, pp. 126–129.

N. Goldberg, "Narrow Channel Forced Air Heat Sink," IEEE Trans. On Components, Hybrids, and Manufacturing Technology, vol. CHMT-7, No. 1, Mar. 1984, pp. 154–159.

C. Hilbert et al., "High Performance Micro-Channel Air Cooling," Sixth IEEE Semiconductor Thermal and Temperature Measurement Symposium, Scottsdale, Ariz., Feb. 6–8, 1990, pp. 108–113.

*Primary Examiner*—Rolf Hille
*Assistant Examiner*—David Ostrowski
*Attorney, Agent, or Firm*—Eugene S. Indyk

[57] ABSTRACT

Dissipation of the heat produced by the operation of electronic circuitry may be improved by a heat sink which comprises a flat base from which a number of vertical fins extend. The fins are parallel to one another and define a number of parallel channels into which coolant flow is directed. The thermal resistance of the heat sink is optimized by setting fin thickness and channel width parameters to appropriate values. The heat sink may be attached in a heat conductive manner to a heat producing electronic component. One or more of these heat sinked components may be laid out in an in-line or staggered arrangement on a support in the form of a circuit pack. Cooling fluid is delivered to the circuit pack in a variety of ways to cool the heat sinked components. A method of determining the optimum fin thickness and channel width parameters involves determining a relationship between total thermal resistance of the heat sink and combinations of fin thickness and channel width parameters. A contour plot is produced in accordance with the relationship referred to above. The contour plot shows regions of optimum heat dissipation for heat sinks in accordance with the geometry identified here.

11 Claims, 14 Drawing Sheets

5,304,846

NARROW CHANNEL FINNED HEAT SINKING FOR COOLING HIGH POWER ELECTRONIC COMPONENTS

This application is a continuation of application Ser. No. 07/807,687, filed on Dec. 16, 1991 now abandoned.

CROSS REFERENCE TO RELATED APPLICATION

This application is related to U.S. application Ser. No. 07/807,688, of Azar, entitled "Circuit Pack Layout With Improved Dissipation of Heat Produced By High Power Electronic Components", filed in the U.S. Patent and Trademark Office on the same day this application was filed in the U.S. Patent and Trademark Office.

FIELD OF THE INVENTION

This invention relates to the cooling of heat-producing electronic components. More particularly, this invention relates to heat sinks, coolant delivery systems, circuit layouts, and methods of optimizing the dimensions of heat sinks.

BACKGROUND OF THE INVENTION

Effectively dissipating the heat produced by the operation of electronic components is an important concern in optimizing the performance of the circuitry in which those components are used. In addition to optimizing performance, effective heat dissipation also helps to prolong the useful life of those components. Heat dissipation is particularly important in the case of high power electronic components which may produce three watts per square centimeter or more. Some exotic methods of cooling high power electronic components, such as forced liquid cooling of heat sinks attached to those components, have been proposed, but these methods are not desirable because they are costly to implement and maintain. Simple air cooling techniques have been avoided because of the inadequate performance of heat sinks and coolant delivery systems developed to date and because of a general perception that air cooing is not up to the task of adequately dissipating the heat produced by today's high power electronic components.

There has been some work involving the use of air cooled narrow channel and microchannel heat sinks to cool electronic components. For example, Goldberg, "Narrow Channel Forced Air Heat Sink," *IEEE Transactions on Components, Hybrids, and Manufacturing Technology*, Vol. CHMT-7, No. 1, March 1984, pp. 154–159 refers to confined channel heat sinks in which channel spacing and width were either 0.0127 cm., 0.0254 cm. or 0.0635 cm. Air was used as the cooling fluid and it was ducted directly to the heat sink. The heat sink of Goldberg was said to have achieved thermal impedances of 3.4° to 5.9° C. per watt.

Hilbert et al., "High Performance Micro Channel Air Cooling," *Proceedings of the Sixth Annual IEEE SEMI-THERM Symposium*, pp. 108–113, 1990, refers to an array of microchannel finned heat sinks in which air was specially ducted to the top of each heat sink. The heat sinks were said to have achieved thermal impedances in the range of 1.6° to 2.1° C. per watt.

Both Goldberg and Hilbert do not deal with heat sinks having an optimum configuration which maximizes their heat dissipation capability. In addition, both Goldberg and Hilbert refer to unusually shaped heat sinks which are difficult and expensive to manufacture. Also, Goldberg and Hilbert achieve the performance they achieve with coolant delivery systems which are non-standard in most electronic systems. Most electronic systems either push or pull air flow across electronic components which are situated on flat circuit boards which are disposed in a parallel configuration in bays or racks in a cabinet. There is a fan shelf placed at the top or bottom of the system to force air into the cabinet and through the spaces between the parallel circuit cards. The flow impingement techniques of Goldberg and Hilbert cannot be used with, or readily adapted to, these kinds of cooling arrangements.

Efforts such as those of Goldberg and Hilbert, therefore, really have not satisfied a long felt need to provide a cooling system for electronic components which is able to most effectively dissipate the heat generated by today's high power electronic components using simple air cooling technology without drastic change of the mechanical arrangement of the components.

SUMMARY OF THE INVENTION

The need for adequate heat dissipation capabilities noted above is satisfied by a novel open channel heat sink which is dimensioned in a fashion which optimizes the heat dissipation capability of the heat sink. The heat sink comprises a plurality of fins, each having a predetermined thickness and a predetermined height. A plurality of channels each having a predetermined width are located between the fins of the heat sink. The heat dissipation capability of the heat sink can be optimized if fin thickness and channel width parameters are jointly and appropriately selected. For example, the heat dissipation capability of the heat sink is optimized if the ratio of the fin thickness to the fin height is about 0.005 to about 0.055 and the ratio of the channel width to the fin height is about 0.030 to about 0.130.

A novel method of determining the optimum configuration of a heat sink so that heat generated by components connected to the heat sink is most effectively dissipated involves determining combinations of a fin thickness parameter and a channel width parameter which produce a desired thermal resistance. In a specific example of the method, a relationship between a thermal resistance parameter and a combination of parameters relating to fin thickness and channel width is derived. Combinations of parameters relating to fin thickness and channel width are found which give a minimum value of the thermal resistance parameter.

DETAILED DESCRIPTION

Figure 1:
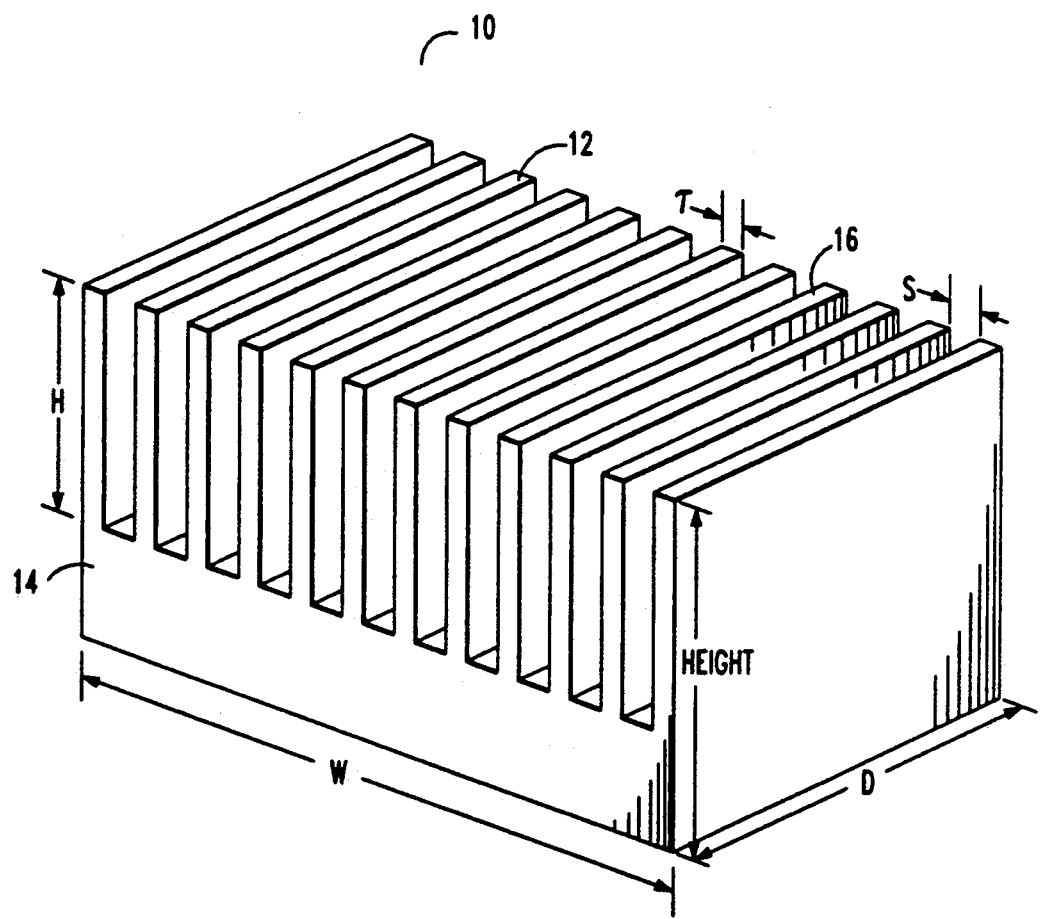
FIG. 1 shows an example of a narrow channel heat sink in accordance with this invention.

FIG. 1 shows an example of an optimized heat sink 10 in accordance with this invention. The heat sink 10 comprises a row of fins 12, one of which explicitly bears the reference numeral 12 in FIG. 1. Each fin has a predetermined height H and a predetermined thickness $\tau$. The height H may be from about 0.25 cm. to about 3.2 cm. The fins project from a rectangularly shaped base 14 of the heat sink 10. The base 14 has a predetermined width W and a predetermined depth D. For example, the width of the base 14 may be about 2.5 cm and the depth of the base 14 likewise may be about 2.5 cm. The overall height of the heat sink, from the bottom of the base 14 to the tips of the fins 12, may be about 3.8 cm. to about 7.6 cm. Although the base 14 of the heat sink 10 in the example of FIG. 1 is rectangular, the base may be any convenient shape such as circular, rectangular, or triangular.

The fins 12 comprise rectangularly shaped protrusions standing substantially upright on the base 14. The fins 12 extend substantially from the front to the back of the heat sink and define a plurality of parallel rectangular channels or grooves of predetermined substantially constant width S between adjacent fins 12. As shown in FIG. 1, the channels are open at the top of the heat sink 10. The fins 12 have substantially rectangular cross-sections parallel and perpendicular to the longitudinal axes of the channels. In accordance with the invention, and as described in more detail below, the fin thickness $\tau$ and the channel width S are selected so that the heat dissipation capabilities of the heat sink are optimized.

The heat sink is attached to a heat producing electronic component in any heat conductive manner. For example, the heat sink can be attached to such a component by means of a heat conductive adhesive, such as a heat conductive epoxy.

The heat sink 10 in FIG. 1 may be made from any suitable heat conductive material such as aluminum, copper, or other metallic material. It may also be a semiconductor, a ceramic, a composite, or an alloy. The channels and fins may be formed in a rectangular block of such head conductive material by any of a variety of methods. For example, the channels and the fins may be created by techniques such as crystal-orientation-dependent etching, precision sawing, electric discharge machining, or numerically controlled machining.

Another configuration that a heat sink in accordance with this invention may take is a folded fin heat sink similar to those used in air conditioning and automotive radiators. The fabrication technique used to make folded fin heat sinks can produce fin thicknesses and spacings in the range of interest at a relatively low cost. In a typical application, aluminum sheet in the desired thickness is folded over in a serpentine fashion so that a desired channel spacing is created. This folded fin may then be bonded to an aluminum base, for example, by dip brazing. The heat sink can then be attached to an electronic device in any manner which promotes conduction of heat from the device to the heat sink. For example, the device may be attached via some heat conductive epoxy. The heat sink can also be attached to the electronic component by any other mechanical means which puts the device in intimate heat conductive contact with the heat sink. The folded fin construction has the advantage of connecting adjacent fin tips which makes the heat sink more resistant to damage from handling. One advantage of using such a folded fin heat sink is that it may be lanced, offset, or wavey to break up thermal boundary layers which may form in the cooling fluid flow.

In has been found that the heat dissipation performance of a heat sink, such as the heat sink 10 of FIG. 1 or the folded fin heat sink described above, can be optimized by appropriately selecting a combination of fin thickness and channel width parameters. In particular, we have found that for a given pressure drop across the heat sink, there is an optimum range of fin thicknesses and an optimum range of spacings between the fins. The performance of such an optimized heat sink in terms of thermal resistance and heat dissipation capability is substantially improved as compared with prior heat sinks. It has been found that this improvement in performance may be achieved if the ratio of the predetermined fin thickness to predetermined fin height, i.e., $\tau/H$, is from about 0.005 to about 0.055 and the ratio of the predetermined channel width to the predetermined fin height, i.e., $S/H$, is from about 0.030 to about 0.130 for pressure drops across the heat sink of about 0.05 cm $H_2O$ to about 1.5 cm $H_2O$. The actual ranges within which these ratios fall may be selected so as to optimize the heat dissipation capabilities of the heat sink for some specific fluid pressure drops expected to be found across the heat sink. In one specific example of this invention, the ratio of the fin thickness to the fin height may be from about 0.005 to 0.055 and the ratio of the channel width to fin height may be from about 0.08 to 0.13 for a pressure drop of about 0.05 cm $H_2O$. In a second example of this invention, the ratio of the fin thickness to the fin height may be from about 0.005 to about 0.055 and the ratio of the channel width to fin height may be from about 0.060 to about 0.110 for a pressure drop of 0.15 cm. $H_2O$. In a third example of this invention, the ratio of the fin thickness to fin height may be from about 0.005 to 0.055 and the ratio of the channel width to the fin height may be from about 0.040 to about 0.090 for a pressure drop of 0.05 cm. $H_2O$. In fourth example of this invention, the ratio of the fin thickness to the fin height may be from about 0.005 to 0.055 and the ratio of the channel width to fin height may be from about 0.03 to 0.08 for a pressure drop of 1.5 cm $H_2O$.

As shown in FIGS. 12-15, there are specific optimum values for the channel spacing parameter and the fin thickness parameter for representative values of pressure drop across the heat sink. These optimum values are those for which thermal impedance is a minimum and the heat dissipation is, therefore, a maximum. Those values are:

a.) about 0.103 for the channel spacing parameter S/H and about 0.014 for the fin thickness parameter $\tau/H$ at a pressure difference $\Delta P$ across the heat sink of about 0.05 cm. $H_2O$;

b.) about 0.077 for the channel spacing parameter S/H and about 0.014 for the fin thickness parameter $\tau/H$ at a pressure difference $\Delta P$ across the heat sink of about 0.15 cm. $H_2O$;

c.) about 0.057 for the channel spacing parameter S/H and about 0.014 for the fin thickness parameter $\tau/H$ at a pressure difference $\Delta P$ across the heat sink of about 0.5 cm. $H_2O$; and d.) about 0.045 for the channel spacing parameter S/H and about 0.015 for the fin thickness parameter $\tau/H$ for a pressure difference $\Delta P$ across the heat sink of about 1.5 cm. $H_2O$.

The thermal impedances for the heat sinks of items a.)-d.) above were about 2.4° C. per watt, 1.54° C. per watt, 0.94° C. per watt, and 0.61° C./watt, respectively.

In one specific example of a heat sink in accordance with this invention, tests of which are described in detail below, the dimensions of the base 14 of the heat sink comprise a width dimension of 2.5 cm. and a length dimension of 2.5 cm. The total height of the heat sink from the bottom of the base 14 to the tips of the fins 12 is about 2.0 cm. The height H of each fin 12 is about 1.25 cm., the thickness $\tau$ of each fin 12 is about 0.4 mm, and the width S of each channel is about 1.1 mm. As a result of actual tests, it has been found that the heat produced by an electronic component attached to the base of such a heat sink is more effectively dissipated than is the case with prior heat sinks. A significantly reduced temperature rise results from the operation of electronic components in a circuit pack containing this heat sink. The thermal resistances of such a heat sink is substantially reduced as compared with the thermal resistances of prior heat sinks used under similar circumstances.

Figure 2:
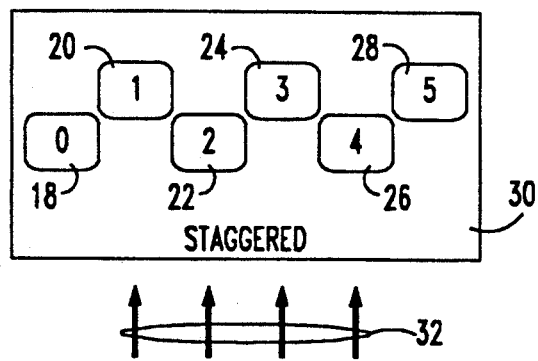
FIG. 2 shows an example of a circuit pack in accordance with this invention having a staggered configuration of heat sinked electronic components.
Figure 5:
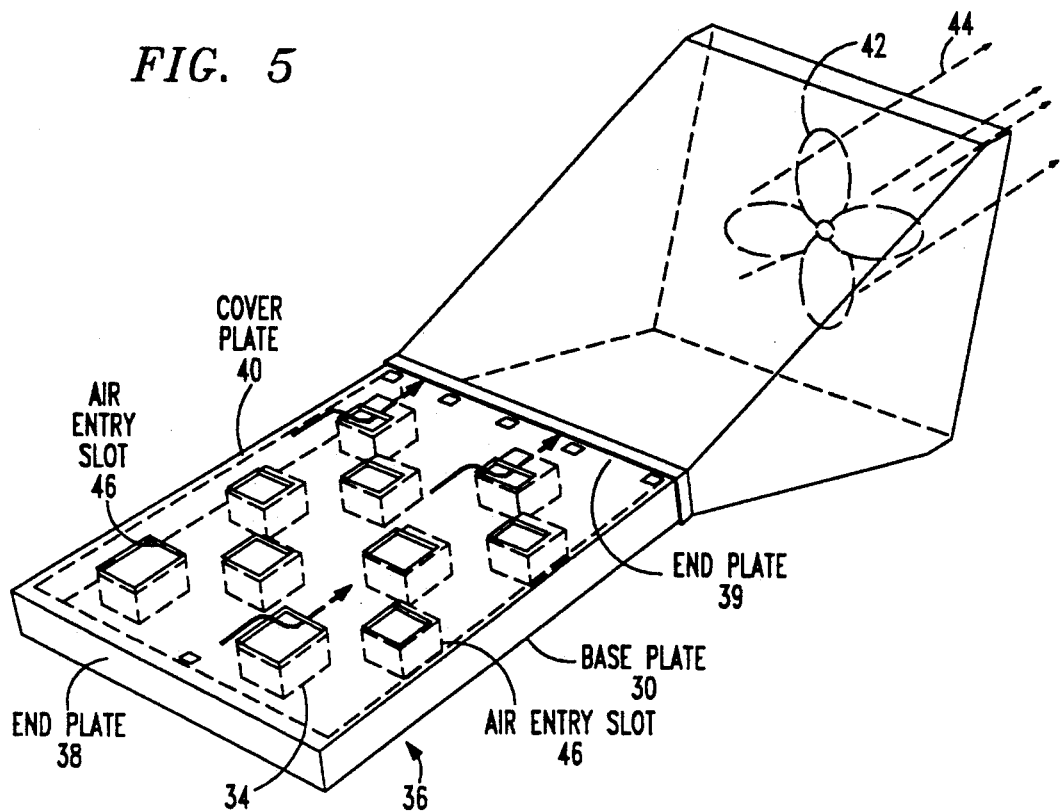
FIG. 5 shows a coolant delivery apparatus for cooling the circuit packs shown in any of FIGS. 2 through 4.
Figure 6:
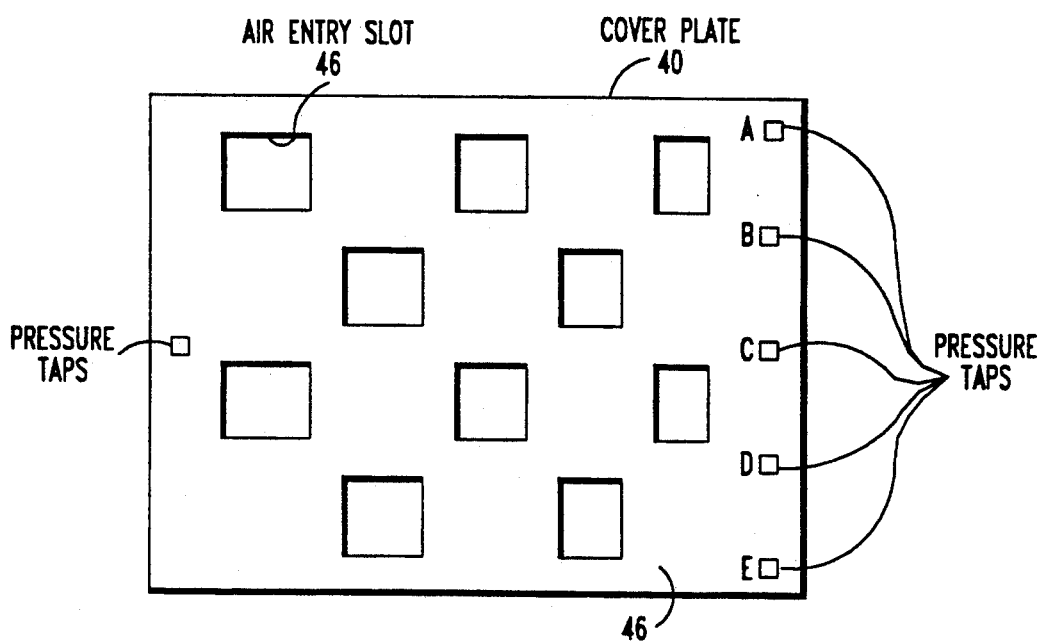
FIG. 6 is a top view of a portion of the apparatus shown in FIG. 5 illustrating air entry slots and pressure taps in the top plate of an enclosure for the circuit pack.

FIG. 2 shows an example of a layout of elements in a circuit pack in accordance with this invention. FIG. 2 shows schematically a circuit pack comprising six circuit elements 18, 20, 22, 24, 26, and 28, which are situated on a base plate 30 which, for example, may be made of a glass-epoxy material. The circuit pack, as is more evident in FIGS. 5 and 6, is enclosed in a housing through which cooling fluid is drawn to cool the heat producing electronic components on the base plate of the circuit pack. The housing and base plate 30 from a sort of wind tunnel which removes the heat produced by those electronic components. In one tested example of the invention, the circuit elements 18, 20, 22, 24, 26, and 28 may each comprise an electronic component attached to an aluminum heat sink having a 2.5 cm by 2.5 cm by 2.0 cm base 14 with fins 12 which are 0.4 mm thick defining parallel channels which are 1.1 mm wide. The channels of the heat sinks are oriented generally parallel to the direction of fluid flow though the housing indicated by arrows 32. A transistor is one example of an electronic component which may be attached in any heat conductive manner to the base of the heat sink. As shown in FIG. 2, the heat sinked components are arranged in a row extending perpendicularly with respect to the direction of air flow indicated by the arrows 32 in FIG. 2. Alternate ones of the heat sinked components are also staggered in a direction parallel to the direction of fluid flow. The minimum spacing between adjacent heat sinks may be about 0.254 cm.

Figure 3:
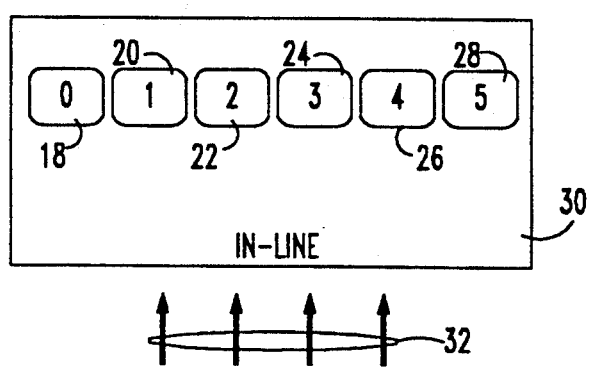
FIG. 3 shows an example of a circuit pack in accordance with this invention having an in-line configuration of heat sinked electronic components.

FIG. 3 shows an alternative component layout for a circuit pack in accordance with this invention. The circuit elements 18, 20, 22, 24, 26, and 28 are situated on base plate 30 in an in-line configuration comprising a number of heat sinked components arranged in a row extending perpendicularly with respect to the direction of air flow illustrated by the arrows 32. The channels of the heat sinks are arranged generally parallel to the direction of coolant flow indicated by arrows 32. The heat sinked components are not staggered as they are in FIG. 2.

Figure 4:
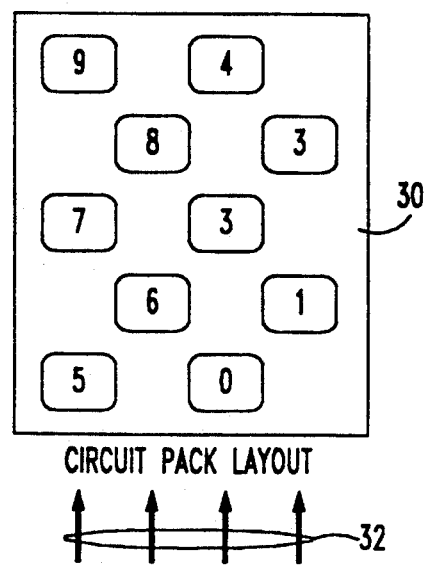
FIG. 4 shows an example of a circuit pack in accordance with this invention having a plurality of rows of staggered heat sinked components.

FIG. 4 is yet another component layout for a circuit pack. FIG. 4 shows an arrangement of heat sinked components, one of which has been given a reference numeral 34 in FIG. 4. The arrangement in FIG. 4 may be considered a combination of an in-line and staggered configuration of heat sinked components which are generally uniformly distributed on the base plate 30 in FIG. 4.

In FIG. 4, there are five rows of heat sinked components. Each row comprises two heat sinked components located on a line perpendicular to the direction of coolant flow indicated by arrows 32. The components in each row are staggered with respect to the components in adjacent rows in a direction perpendicular to the direction of coolant flow. This is to ensure that each component is not located in the direct wakes of adjacent components created by flow of cooling fluid through the circuit pack housing. This arrangement has been found to improve the heat dissipation capabilities of the circuit pack.

FIGS. 5 and 6 illustrate an apparatus for delivery of cooling air to the heat sinked components. FIG. 5 shows a structure 36 which comprises a rectangular housing for enclosing a number of heat sinked components mounted on a base plate 30 as shown in any one of FIGS. 2 to 4. The enclosure comprises the aforementioned base plate 30 shown in any of FIGS. 2 to 4, vertically disposed ends plates 38 and 39, and a horizontally disposed cover plate 40. Two vertically disposed side plates are situated on the front and back of the FIG. 5 apparatus between the base plate 30 and the cover plate 40. The end plates 38 and 39, the cover plate 40, and the side plates may be made of a plastic material such that sold under the LEXAN trademark. The base plate 30, end plates 38 and 39, cover plate 40, and the two side plates define a rectangular housing into which the heat sinked components are arranged as shown in any one of FIGS. 2 to 4. The vertical spacing between the cover plate 40 and the base plate 30 is such that a controlled amount of space is defined between the cover plate 40 and the tips of the heat sinks connected to the electronic components. The spacing between the cover plate and tips of the heat sinks may be from about zero to about 0.25 cm., for example. Preferably, the spacing between the tips of the heat sinks and the cover plate 40 is made as small as possible. In some preferred examples of the invention, the cover plate 40 may be positioned so that there is no clearance between the tips of the heat sink fins and the cover plate 40.

One end of the circuit pack and housing shown in FIG. 5 communicates with a fan 42 located in a flared structure attached to the end of that apparatus. Any mechanism which creates a flow of coolant through the circuit pack and housing may be used instead of the fan 42 and flared structure shown in FIG. 5. The fan 42 draws cooling air into one or more inlet openings in the circuit pack housing, across the heat sinks, and out through one or more openings in the end plate 39 of the circuit pack housing. The outlet openings can be one or more appropriately sized circular openings in an end wall 39 of the housing adjacent the fan and opposing the end plate 38. Flow of cooling fluid through the apparatus of FIG. 5 between the cover plate 40 and the base plate 30 dissipates the heat generated by the operation of the electronic components attached to the heat sinks. The fan 42 exhausts air heated by contact with the heat sinks as indicated by the arrows 44 shown in FIG. 5.

There are two ways in which cooling air may be introduced through one or more inlet openings into the circuit pack housing of FIG. 5. One preferred way in which air is input to the apparatus of FIG. 5 is by the provision of a number of air entry slots 46 in the cover plate 40 as indicated in FIG. 6. There preferably is one such air entry slot 46 substantially superimposed over each of the heat sinks of the circuit pack. The illustration of the cover plate 40 in FIG. 6 shows an arrangement of air entry slots 46 for the circuit pack layout shown in FIG. 4 which involves one air entry slot 46 superimposed over each of the heat sinked components 34 as shown in FIG. 4. FIG. 6 also shows a number of pressure taps in the cover plate 40 which can be used to make air pressure measurements in the circuit pack indicated in the test results described below.

In this example of a circuit pack in accordance with this invention, the fan 42 draws cooling air through each of the air entry slots 46. The cooling air impinges on the heat sinks directly below each slot 46 in a direction perpendicular to the plane of the base plate 30, and then is drawn in a horizontal direction parallel to the base plate 30 through the channels between the fins of the heat sinks. The cooling air then is exhausted as shown by the arrows 44 in FIG. 5.

In one embodiment of such an air delivery system, involving air entry slots 46 in the cover plate 40, the sixes of the air entry slots 46 may be made different so that a uniform, balanced coolant flow is maintained throughout the circuit pack housing. In particular, the sizes of the slots may be make progressively smaller the farther downstream they are located. For example, as shown in FIG. 6, the two slots further upstream have length and width dimensions which are approximately the same as the width and depth dimensions of the heat sinks centered under those upstream slots 46, namely, about 2.5 cm. by 2.5 cm. in the example described above. The length dimensions of the slots 46 gradually decrease the further downstream they are located. The length dimension of the two slots further downstream may be only about 60% of the length dimension of the slots furthest upstream in this example of the invention, namely, 1.5 cm. in the example described above.

An alternative method of delivering cooling air to a circuit pack, such as the one shown in FIGS. 5 and 6, involves the provision of a solid or unslotted top plate 40 and the removal of the end plate 38. In this case, cooling air is drawn through the opening in the end of the circuit pack housing, through the channels of the heat sinks in the circuit pack in a direction parallel to the base plate, 30, and out the exhaust as indicated by arrows 44 in FIG. 5.

Detailed Experimental Examples

An actual heat sink was constructed of a block of aluminum which was 2.5 cm. wide by 2.5 cm. long by 2.0 cm. high. Fins 0.4 mm thick were machined 1.1 mm apart in the top surface of the block of aluminum, as shown in FIG. 1. A transistor was used as the heat source and it was affixed to the heat sink in a 1.5 cm.$^2$ groove in the base plate of the heat sink. A transistor was used as a heat source because it can produce high wattage and is moderately compact about (1 cm.$^2$). A circuit pack made of glass-epoxy (27.5 cm.$\times$20 cm.) supported a number of these heat sinked components. The components were placed in the staggered and in-line arrangements of FIGS. 2-4 to investigate the effect of circuit pack layout. The distance between the edges of adjacent heat sinks was about 0.127 cm. in FIGS. 2 and 3. The vertical separation between alternate rows of components in FIG. 4, for example, the vertical distance between components numbered 5 and 7 in FIG. 4, was about 6.35 cm. The vertical distance between adjacent rows of components in FIG. 4, for example, the vertical distance between the edges of the components numbered 5 and 6 in FIG. 4, was about 2 cm. The horizontal separation between the vertical rows of components in FIG. 4, for example, the horizontal separation between the edges of the components numbered 5 and 6 in FIG. 4, was about 1 cm.

Air was introduced to the heat sinks through slots in the top plate or through the end wall of the circuit pack housing. An impingement configuration was achieved by creating slots, positioned exactly above the components, in the top plate of the circuit pack housing. A second method for air flow introduction was arranged by removing the end plate and replacing the top cover with a solid plate. The data reported here are for both slotted or solid covers.

FIG. 6 shows a circuit pack, housing, and fan acting as a sort of wind tunnel for this experiment. The fan used for the experiment was a EG&G Rotron (Patriot-DC) fan. A top view of the cover plate is shown in FIG. 6 which shows the positions (A, B, C, D, and E) where air pressure was measured. In one case, no clearance between the cover plate and top of the heat sinks existed. The circuit pack was then placed inside what more resembles a conventional wind tunnel, which simulates a typical arrangement of electronic equipment in a frame or bay. In this case, clearance existed between the heat sink tips and the cover plate. This conventional wind tunnel arrangement was used to investigate the effect of flow bypass on thermal performance of the heat sink.

Figure 7:
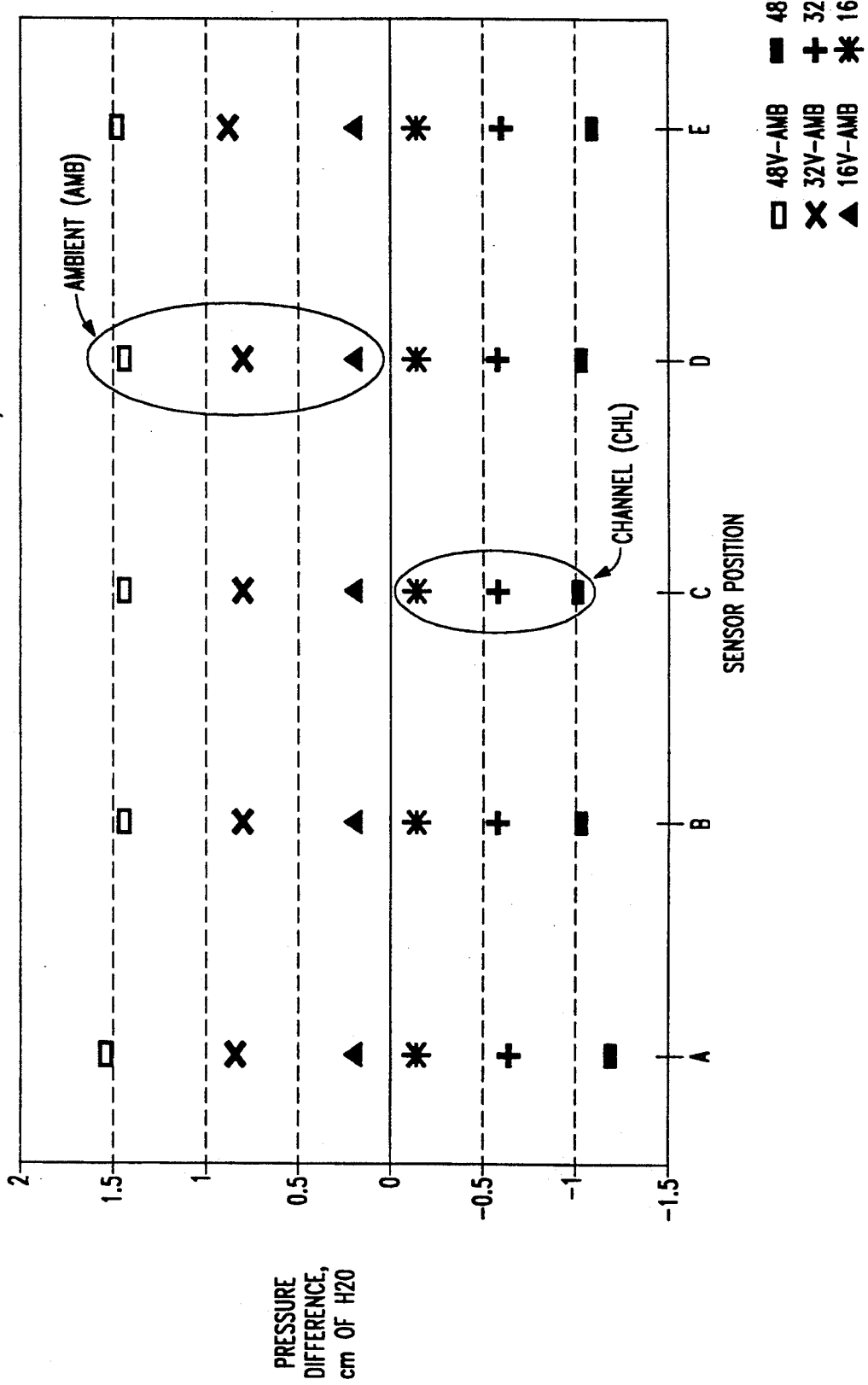
FIG. 7 shows pressure drop measurements with respect to ambient and with respect to channel input for a circuit pack with a staggered heat sinked component configuration.

To determine the thermal performance of a heat sink in accordance with this invention, several parameters were tracked and varied. These included air flow rate, component layout, component power dissipation, and tip clearance. Three different air flow rates, representing low to high amounts of forced air convection cooling, were used. Because of the geometry and component layout, the fan voltage and tunnel pressure drop were recorded as a measure of variation in air flow rate. FIG. 7 shows the pressure drops for three different fan voltages, 16, 32, and 48 volts. These pressure differences are reported with respect to ambient (positive values) and with respect to the inlet of the circuit pack housing (negative values). The air velocity associated with the pressure drops, measured at the center of the channel, were 2.3, 4.8, and 6.6 m/s.

Figure 8:
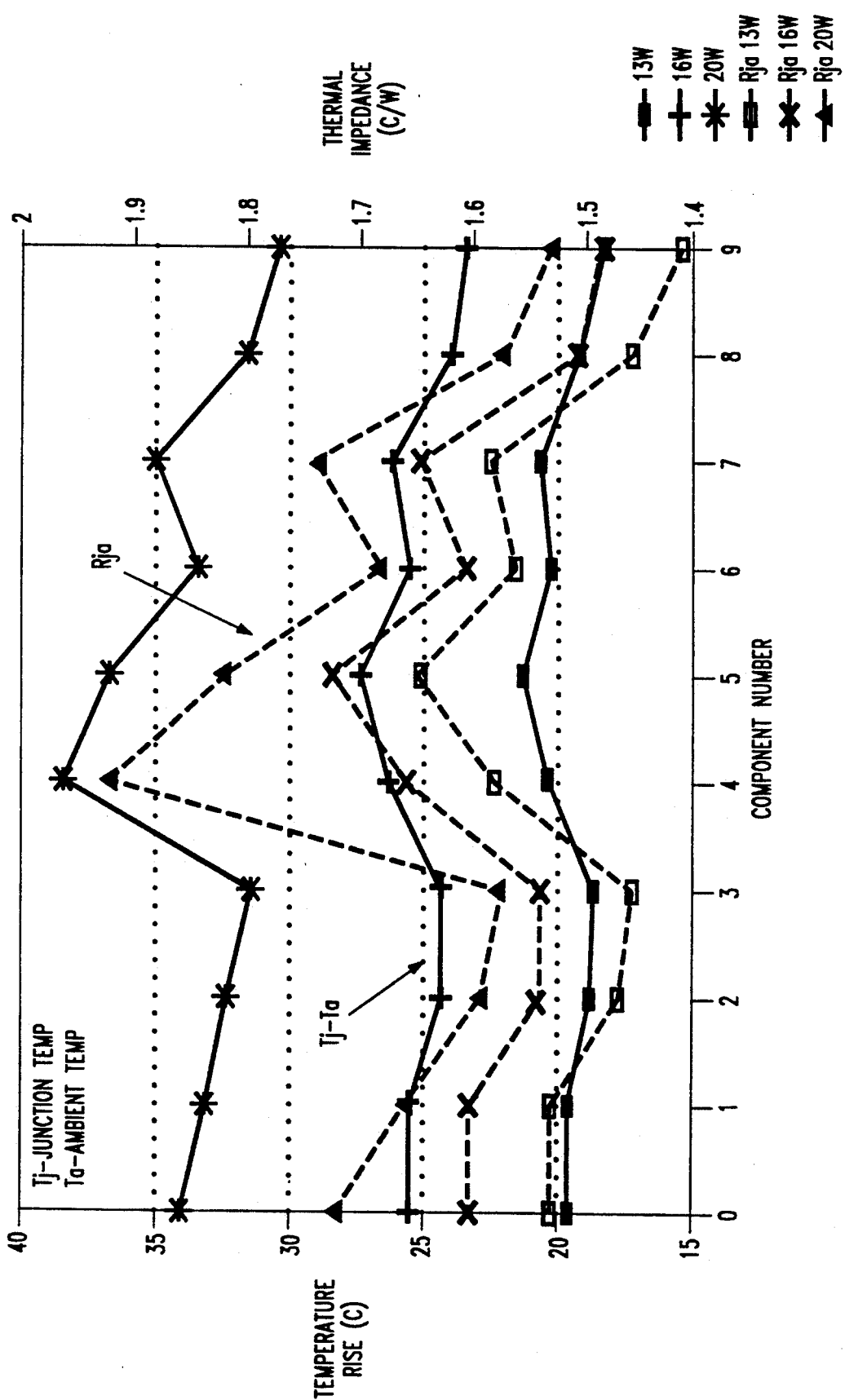
FIGS. 8 and 9 illustrate temperature rises above ambient for each component in a circuit pack with a slotted cover plate for two different fan voltages.
Figure 9:
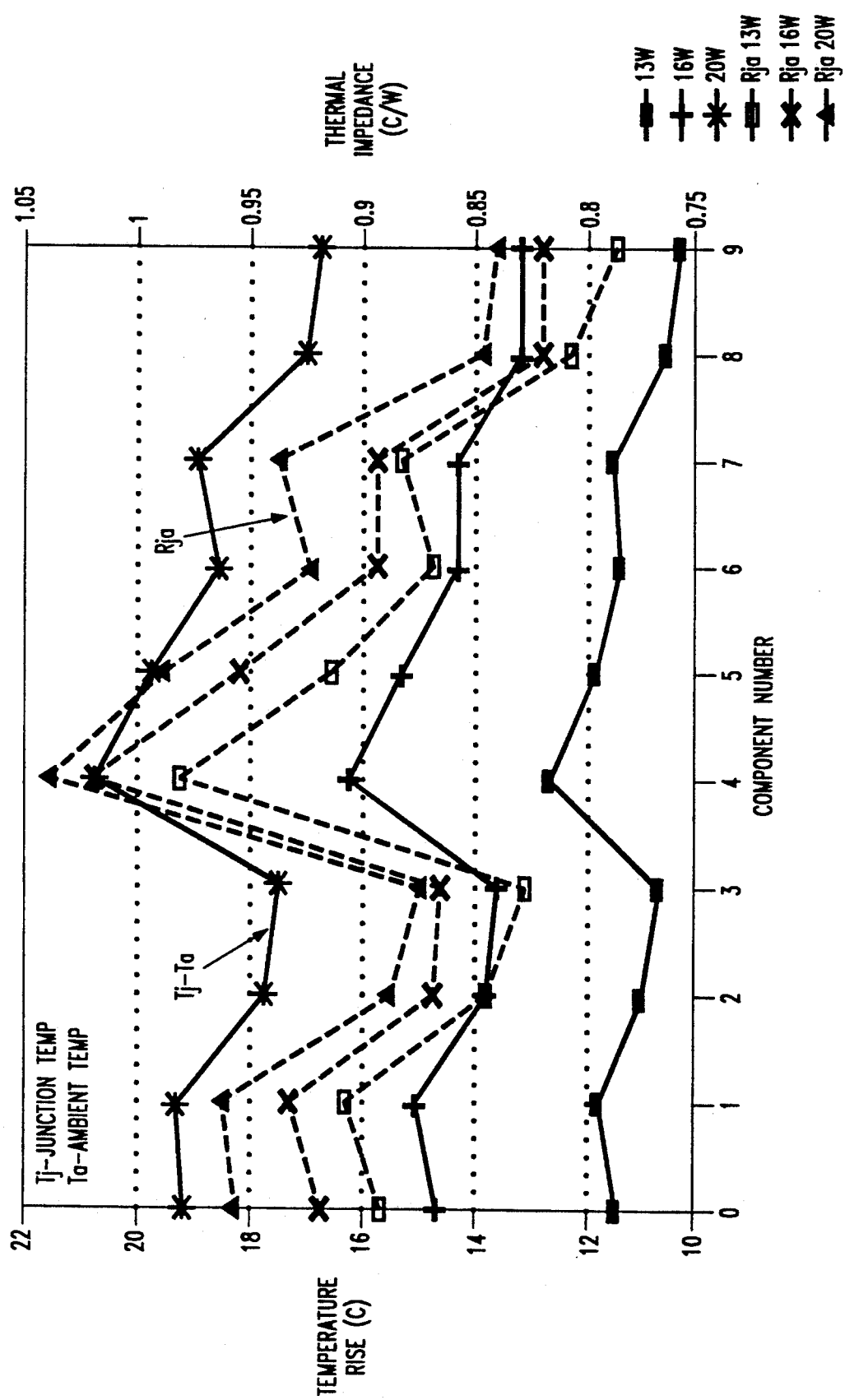

The thermal performance of the heat sink is reported in terms of the temperature rise over ambient $\delta T$ and thermal impedance $\theta_{ja}$. The temperature rise used for calculation of thermal impedance is based on the temperature rise between the heat sink base plate and room ambient. FIGS. 8 and 9 show the $\delta T$ and $\theta_{ja}$ at different component power dissipations (13, 16, and 20W) at 16V and 48V fan voltages, respectively. The abscissa shows the component number on the circuit pack. (Those numbers are reproduced in FIGS. 2–4 in addition to the reference numerals already mentioned in the description above.) For this configuration, air is impinged on the component through the slotted cover plate described above. These show that the temperature rise, even for a low amount of forced air convection cooling, does not exceed 38° C. and $\theta_{ja}$ varies from only 0.78 to only 1.91° C./W, for both air velocities considered. The device junction temperature is well below an industry standard of 125° C. for operation of the device in a worst case ambient temperature of 50° C.

Figure 10:
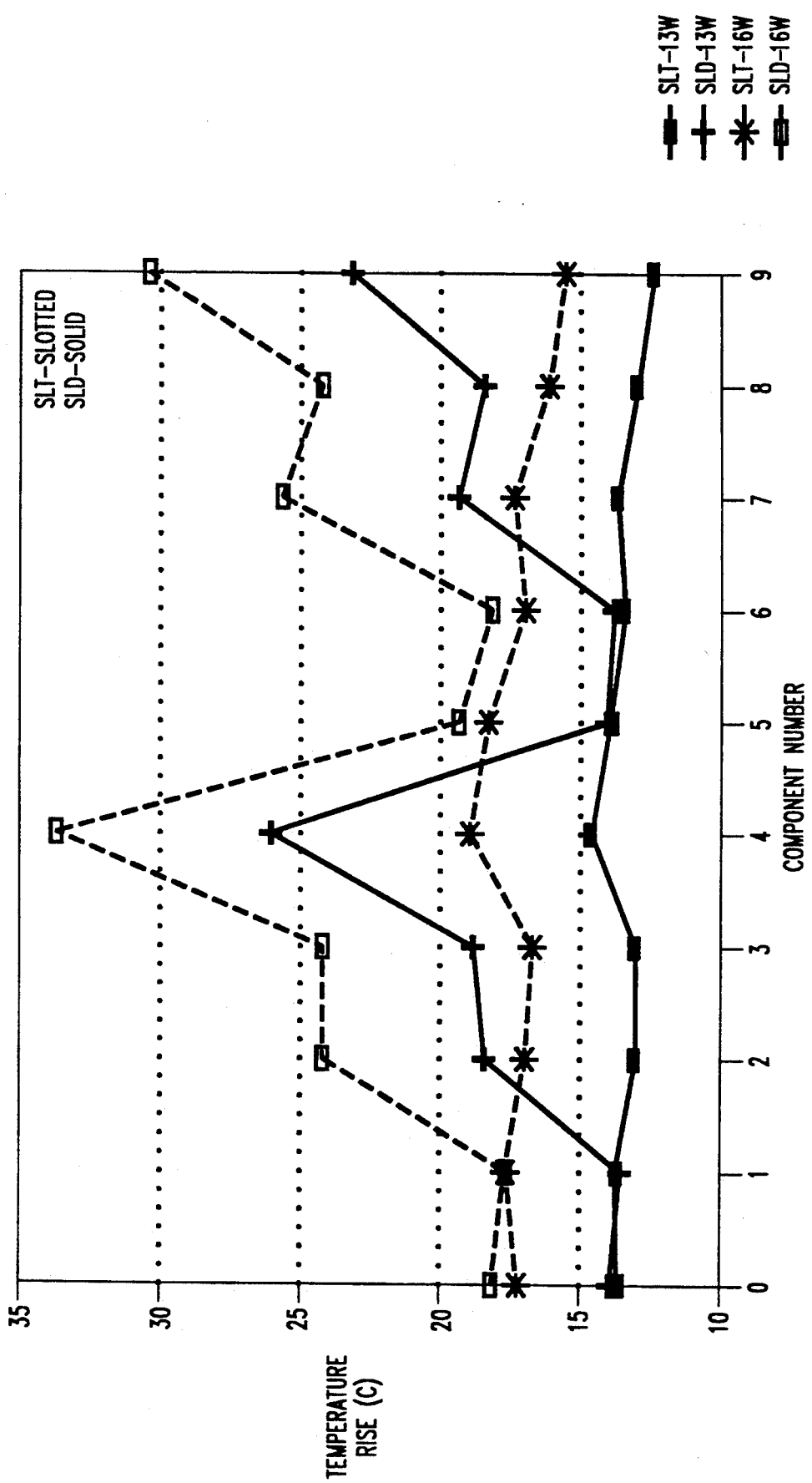
FIG. 10 is a comparison between the performance of circuit packs having a slotted cover plate and a solid cover plate.

FIG. 10 shows the impact of different coolant delivery systems on the dissipation of heat produced by the components and the performance of the heat sinks in the circuit pack. Two component power dissipations (13 and 16W) are reported at a fan voltage of 32V for the slotted and solid cover plates. In the latter, the air flow is parallel to the circuit pack and there is no tip clearance between the heat sink and the cover plate. The figure shows that the air flow direction will impact the temperature rise. Specifically, improved performance is obtained when direct impingement through slots in the cover plate is used. However, the cooing achieved by introducing the flow parallel to the circuit pack through an end wall is still significant and certainly within acceptable design limits. Further, FIG. 10 shows that cooling is a function of component position on the circuit pack and similar levels of cooling can be attained with both types of flow introduction. This is demonstrated by components 5 and 6. One may conclude that exemplary thermal performance of a properly designed narrow channel heat sink in accordance with this invention may be achieved with either coolant delivery system.

Figure 11:
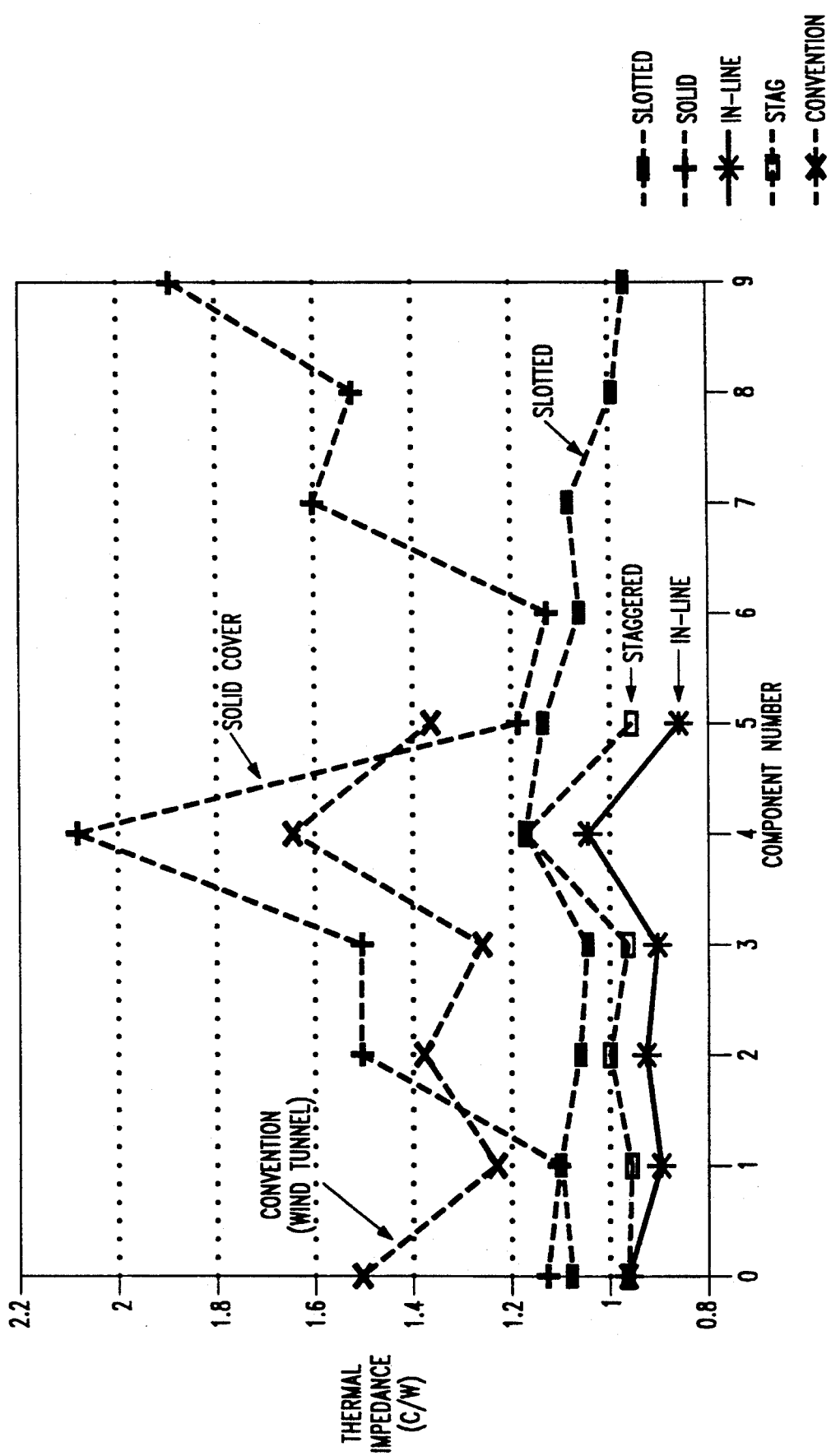
FIG. 11 is a comparison of the effect of circuit pack layout and air flow entry method on thermal impedance.

FIG. 11 further corroborates the conclusion stated above. FIG. 11 shows $\theta_{ja}$ for various flow introduction methods and component arrangements. FIG. 11 also contains data relating to a situation where there is clearance (represented by a curve labeled CONVENTIONAL wind tunnel in FIG. 11) between the tips of the heat sink fins and the cover plate of the circuit pack housing. The clearance was 1.25 cm (worst case) and the power dissipation per component was 16W. The data was taken at a fan voltage of 32V. To have the same air velocity in the circuit pack housing, the pressure drops were matched for the cases where there was tip clearance and where there was no tip clearance.

A couple of points are noteworthy in FIG. 11. The thermal resistance $\theta_{ja}$ found for the situation where there was clearance between the tips of the heat sink fins and the cover plate does not exceed about 1.6° C./W. This indicates that a heat sink cooled with large amount of coolant flow by-pass still performs remarkably well. Although significant improvement can be obtained by directing the flow through slots in the cover plate, the performance is well within most design limits.

The second point to note is component arrangement. In the staggered and in-line circuit pack configurations, the cover plate was solid and there was no tip clearance. The results show that component arrangement does not impair performance as long as components are not placed in the direct wake of any of the other components, immediately down stream of one another, such that flow through the heat sink is blocked or otherwise impaired. Comparison of $\theta_{ja}$ for solid cover, staggered and in-line, in FIG. 11, further corroborates this point. Therefore, one can conclude that properly designed narrow channel heat sinks perform well regardless of component layout on a circuit pack, provided direct blockage is avoided.

Method of Optimizing Heat Sink Dimensions

A method of optimizing the fin thickness ($\tau$) and the space between fins (S) of a narrow channel heat sink is presented. The total thermal impedance, from heat sink base to inlet air, is the sum of the impedance from heat sink base to the local air stream plus the thermal impedance from the local air stream to inlet air:

$$R_{total} = R_{heatsink} + R_{air}$$

where, $$R_{heatsink} = \frac{1}{\eta h A_s},$$

where $\eta$ is the fin efficiency, h is the heat transfer coefficient, and $A_s$ is the surface area of the heat sink.

$$R_{air} = \frac{1}{2\rho A_f V C_p}$$

where $\rho$ is the density of the cooling fluid, in this case air, $A_f$ is flow area of the heat sink, V is the flow velocity, and $C_p$ is the specific heat of the coolant. In the above equations, the fin efficiency ($\eta$), the heat transfer coefficient (h), and the heat sink surface are ($A_s$) are given as follows:

$$\eta = \frac{\tanh(N)}{N},$$

where $$N = H\left(\frac{2h}{K_s \tau}\right)^{0.5}$$

and $K_s$ is the fin conductivity, $$h = \frac{Nu K_f}{D},$$

where $D \approx 2S$, Nu is the Nusselt number, and $K_f$ is the coolant conductivity.

$$A_s \approx \frac{2LWH}{S + \tau},$$

where L is the length of the heat sink in the direction of cooling fluid flow, W is the width of the heat sink, and H is the height of a heat sink fin. The Nusselt number (Nu) for fully developed flow through a high aspect ratio rectangular channel is assumed to be 8. Since the local air stream temperature varies through the channel along a streamline, the average thermal impedance value for $R_{air}$ has been chosen. The error introduced by using the average instead of the log mean temperature difference is small. The flow area ($A_f$) of the heat sink and the flow velocity (V) are given as follows:

$$A_f \approx \frac{SHW}{S+\tau}$$

$$V = \Delta P \frac{S^2}{12\mu L} \text{ (Poiseuille's equation)},$$

where $\Delta P$ is the pressure drop through the heat sink and $\mu$ is the viscosity of the cooling fluid. Substituting these terms in the thermal impedance equation and introducing three dimensionless groups $X=S/H$, $Y=\tau/H$, and $K=K_f Nu/K_s$, the following equation is obtained:

$$R_{total} = \frac{HX(X+Y)(K/XY)^{0.5}}{K_f NuLW(\text{TANH}((K/XY)^{0.5}))} + \frac{6\mu L(X+Y)}{\rho C_p W \Delta P(HX)^3}$$

Figure 12:
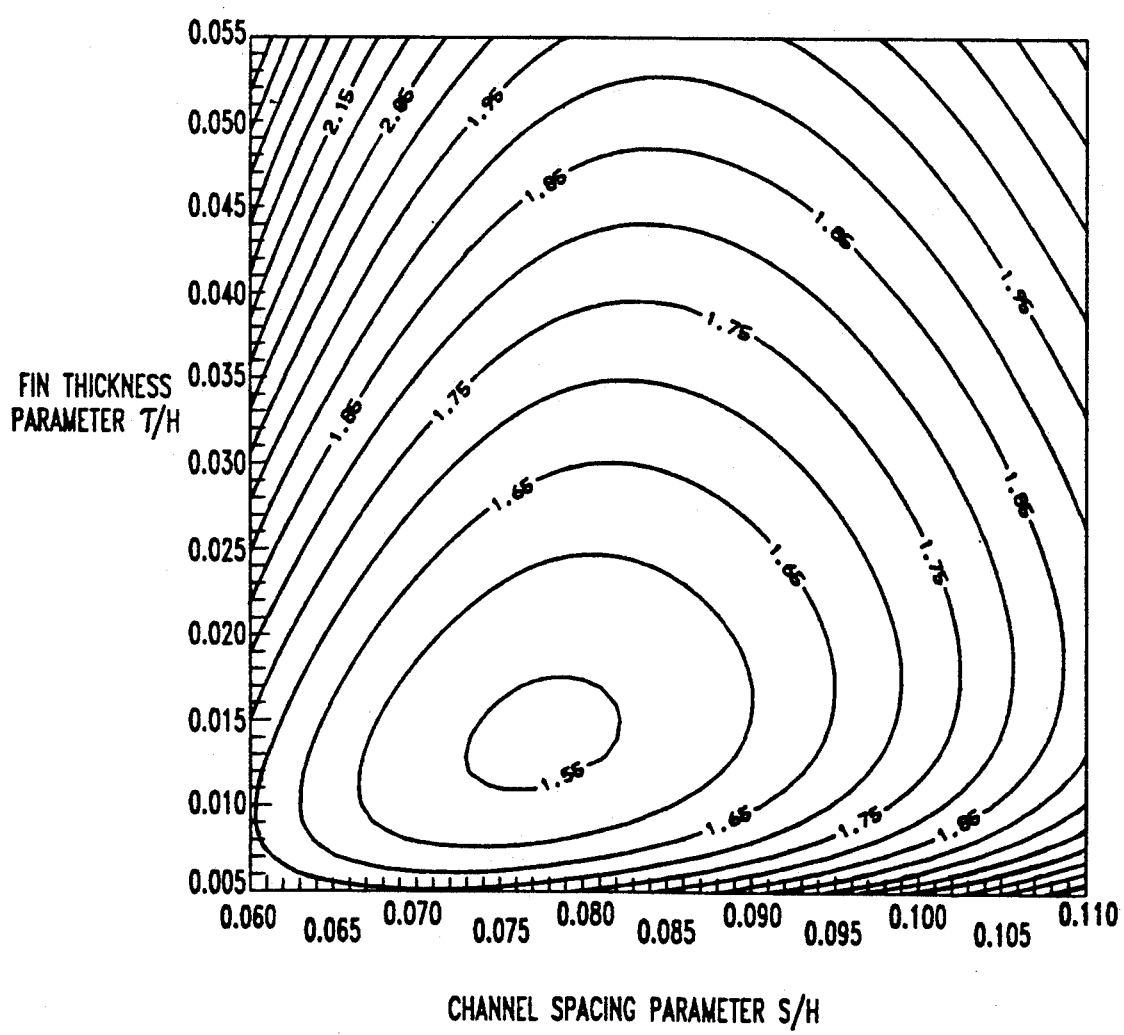
FIGS. 12, 13, 14, and 15 are contour plots illustrating the optimization of heat sink dimensions at four different pressure drops across the heat sink.
Figure 13:
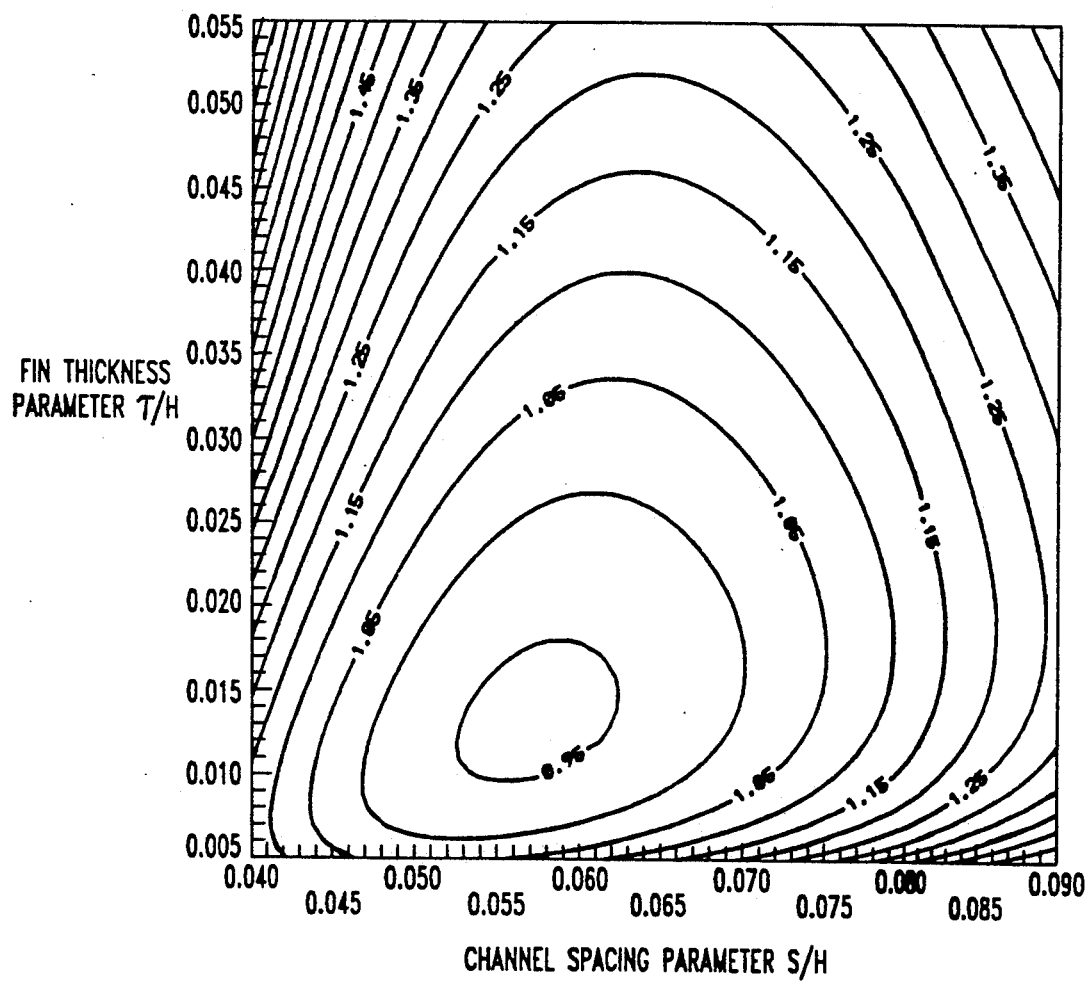

This equation can be optimized for the two independent variables (X) and (Y) in many ways. A graphical method can be used involving the plotting of the total thermal impedance as a function of fin thickness parameter $\tau/H$ and channel spacing parameter $S/H$ in a contour plot using a software package called SURFER available from Golden Software, 807 14th Street, P.O. Box 281, Golden, Colo. 80402. FIG. 12 shows such a plot for an air cooled aluminum heat sink with $L=W=25$ mm, $H=12.5$ mm, and $\Delta P=0.15$ cm of water. The contour plot shows a minimum thermal impedance of 1.54° C./W at $S/H=0.077$ and $\tau/H=0.014$, which corresponds to an optimum channel spacing of 0.96 mm and an optimum fin thickness of 0.18 mm. FIG. 13 shows the effect of higher coolant pressure and velocity with $L=W=25$ mm, $H=12.5$ mm, and $\Delta P=0.5$ cm of water. The contour plot shows a minimum thermal impedance of 0.94° C./W at $S/H=0.057$ and $\tau/H=0.014$ which corresponds to an optimum channel spacing of 0.72 mm and an optimum fin thickness of 0.18 mm.

Figure 14:
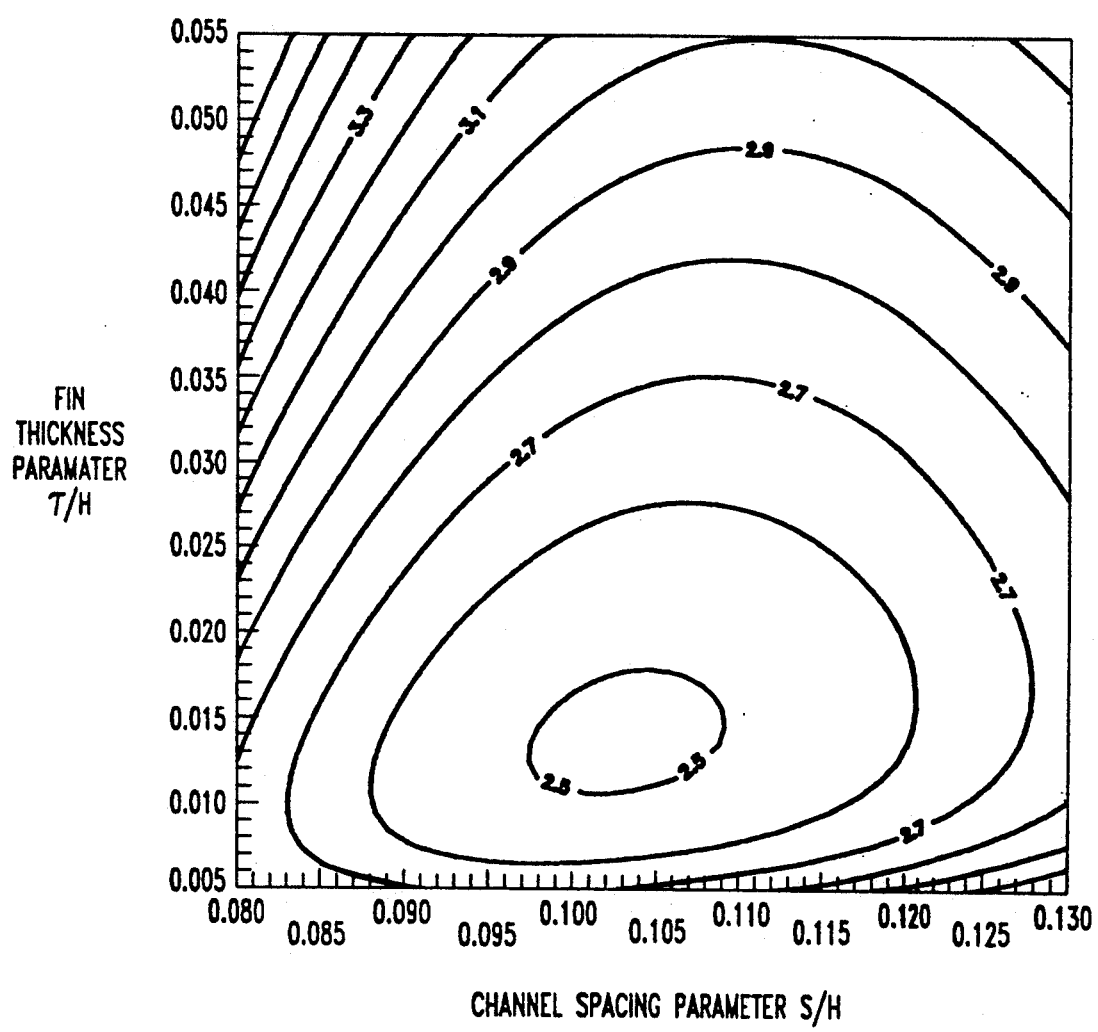
Figure 15:
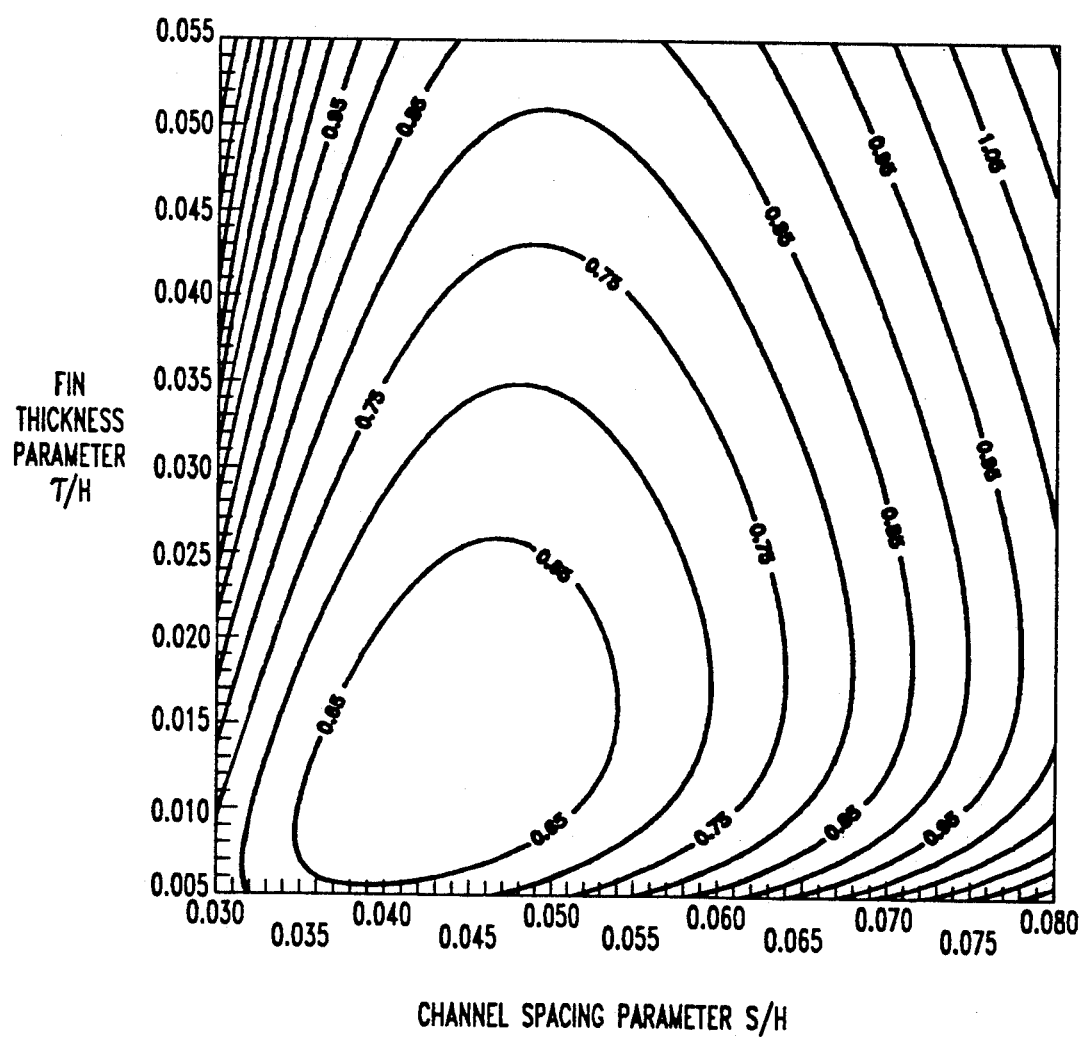

FIG. 14 is a contour plot for a heat sink like that of FIGS. 12 and 13, but for a coolant flow rate which creates a pressure difference $\Delta P$ across the heat sink of 0.05 cm. $H_2O$. The plot of FIG. 14 shows a minimum thermal impedance of 2.4° C./W at $S/H=0.103$ and $\tau/H=0.014$ which corresponds to an optimum channel spacing of 1.287 mm. and an optimum fin thickness of 0.175 mm. FIG. 15 is a contour plot for a heat sink analogous to that of FIGS. 12-14, but for a coolant flow rate which creates a pressure difference of 1.5 cm. $H_2O$. The plot of FIG. 15 shows a minimum thermal impedance of 2.4° C./W at $S/H=0.045$ and $\tau/H=0.015$ which corresponds to an optimum channel spacing of 0.563 mm. and an optimum fin thickness of 0.188 mm. It may be said in light of these results that a most preferred range of channel width is about 0.5 mm. (S/H of about 0.04) to about 1.3 mm. (S/H of about 0.104) and a most preferred range of fin thickness is about 0.17 mm. ($\tau/H$ of about 0.0136) to about 0.19 mm. ($\tau/H$ of about 0.0152) for the heat sinks and pressure drops considered in this detailed example.

Note that the thermal impedance increases rapidly for fin thicknesses and channel spacings less than optimum, and more slowly for fin thicknesses and channel spacings greater than optimum. Due to production variations, it may thus be advantageous to design a heat sink with fin thickness and channel spacing slightly larger than optimum.

Some Alternative Embodiments

Figure 16:
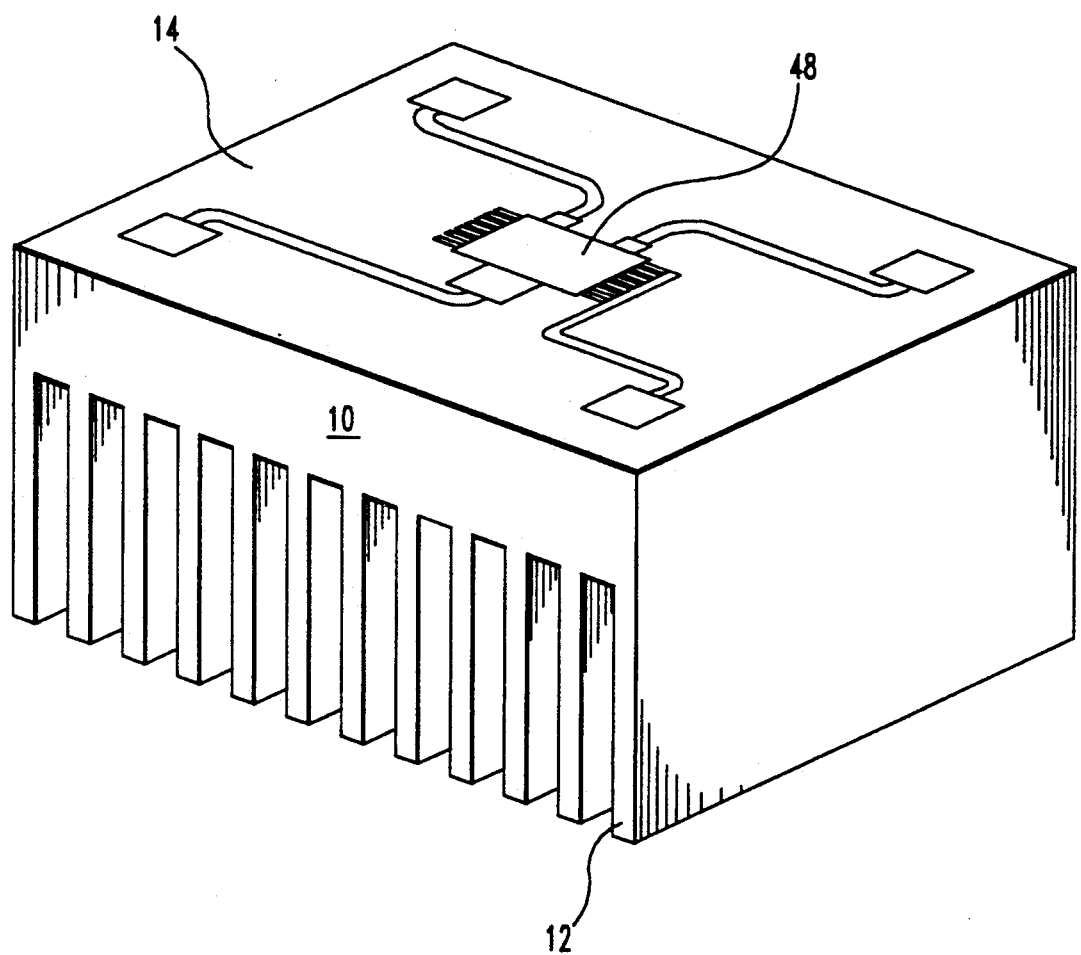
FIG. 16 shows an example of a heat sink in accordance with this invention into which an electronic heat producing component is integrated.

FIG. 16 shows a heat sink in accordance with this invention which has been integrated with a heat producing electronic component. The heat sink of FIG. 16 is created by forming a number of rectangular parallel channels in a rectangular block of semiconductor material which is suitable for the fabrication of integrated circuits. The formation of the channels in the block of semiconductor material creates a series of fins 12 extending from a base 14 having a predetermined height and a predetermined width depending upon the depths of the channels and the distances separating the channels. The channels are formed so that the channel width and fin thickness dimensions are optimized as described above. An integrated circuit 48 is formed in the base 14 of the heat sink by any technique of creating integrated circuits such as photolithography.

Figure 17:
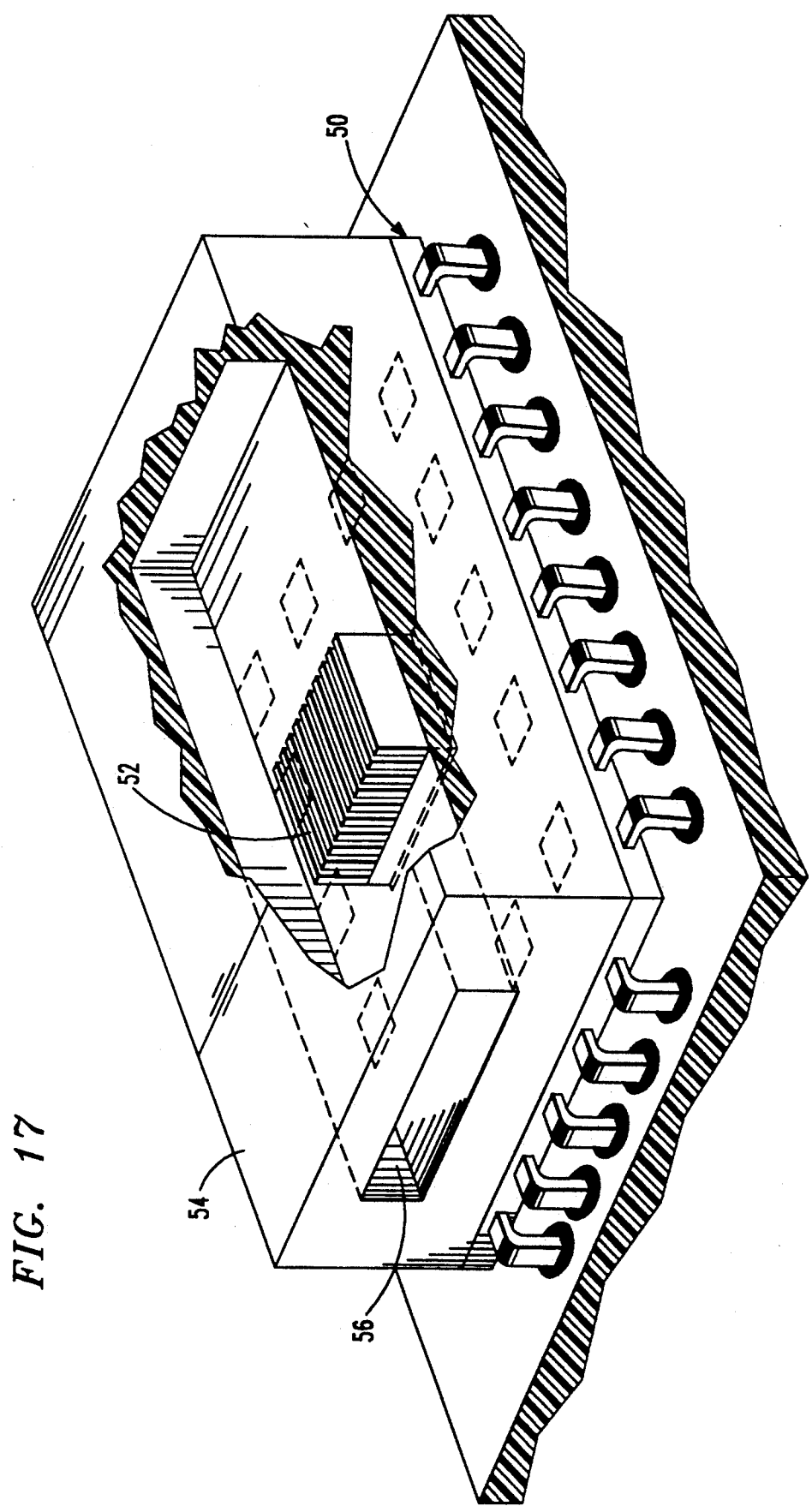
FIG. 17 shows a heat sink in accordance with this invention which has been incorporated into the structure of a molded or encapsulated electronic heat producing component.

FIG. 17 shows a heat sink which has been incorporated into an encapsulated or molded heat producing electronic component 50 such as a hybrid integrated circuit. The component 50 comprises a substrate supporting one or more heat producing electronic components which may be integrated circuits or discrete components. The substrate also supports a heat sink 52 dimensioned in accordance with the design procedures of this invention. The heat sink is attached in heat conductive relationship with one or more heat producing electronic components. The component 50 also includes a molding or encapsulation material 54 which covers the components located on the substrate. A cavity 56 is formed in the encapsulation or molding material 54 which allows cooling fluid flow to be directed through the channels of the heat sink 52 in the component 50. In an alternative arrangement, the heat sink fins may extend outside the encapsulation material 54 and be cooled by coolant flow directed over the exterior of component 50.

Conclusion

A narrow channel heat sink has been described and its thermal performance has been verified. The heat sink's performance is exemplary for a variety of flow directions. Tip clearance (flow bypass) may reduce the thermal performance of the heat sink, but the effect is not significant enough to prevent advantageous use of heat sinks in accordance with this invention in conventional electronic cooling applications. Component layout on the circuit board does not significantly affect thermal performance of the heat sink as long as the flow of cooling fluid through the heat sinks is not blocked. Narrow channel heat sinks require only moderate pressure drops to achieve the improved performance reported here. This is readily attained with standard cooling fans. Narrow channel heat sinks can be readily used to cool high power electronic components. Components dissipating 20 W/cm² (based on heat source area) or higher showed maximum temperature rises of only about 38° C. for moderate forced air convection cooling.

We claim:
1. A heat sink comprising:
   a plurality of rectangular fins, each having a predetermined thickness and a predetermined height; and at least one channel of a predetermined width between the fins;
in which a ratio of the predetermined thickness to the predetermined height is from about 0.005 to about 0.055; and
in which a ratio of the predetermined width to the predetermined height is from about 0.030 to about 0.130.

2. The heat sink of claim 1:
in which the ratio of the predetermined thickness to the predetermined height is from about 0.005 to about 0.055; and
in which the ratio of the predetermined width to the predetermined height is from about 0.080 to about 0.130.

3. The heat sink of claim 1:
in which the ratio of the predetermined thickness to the predetermined height is from about 0.005 to about 0.055; and
in which the ratio of the predetermined width to the predetermined height is from about 0.060 to about 0.110.

4. The heat sink of claim 1:
in which the ratio of the predetermined thickness to the predetermined height is from about 0.005 to about 0.055; and
in which the ratio of the predetermined width to the predetermined height is from about 0.040 to about 0.090.

5. The heat sink of claim 1:
in which the ratio of the predetermined thickness to the predetermined height is from about 0.005 to about 0.055; and
in which the ratio of the predetermined width to the predetermined height is from about 0.030 to about 0.080.

6. The heat sink of claim 1, in which the ratio of the predetermined thickness to the predetermined height is about 0.014 and the ratio of the predetermined width to the predetermined height is about 0.103.

7. The heat sink of claim 1, in which the ratio of the predetermined thickness to the predetermined height is about 0.014 and the ratio of the predetermined width to the predetermined height is about 0.077.

8. The heat sink of claim 1, in which the ratio of the predetermined thickness to the predetermined height is about 0.014 and the ratio of the predetermined width to the predetermined height is about 0.057.

9. The heat sink of claim 1, in which the ratio of the predetermined thickness to the predetermined height is about 0.015 and the ratio of the predetermined width to the predetermined height is about 0.045.

10. The heat sink of claim 1, in which the fin thickness is about 0.4 mm. and the channel width is about 1.1 mm.

11. The heat sink of claim 1, in which the fins and channels are formed in a block of semiconductor material.

* * * * *